(12) United States Patent
Wang et al.

(10) Patent No.: US 7,563,641 B2
(45) Date of Patent: Jul. 21, 2009

(54) LAMINATED LIGHT-EMITTING DIODE DISPLAY DEVICE AND MANUFACTURING METHOD THEREOF

(75) Inventors: Bily Wang, Hsin Chu (TW); Jonnie Chuang, Pan Chiao (TW); Chuanfa Lin, Shu Lin (TW); Chao-Yuan Huang, Tai Chung (TW)

(73) Assignee: Harvatek Corporation, Hsin Chu (TW)

( * ) Notice: Subject to any disclaimer, the term of this patent is extended or adjusted under 35 U.S.C. 154(b) by 288 days.

(21) Appl. No.: 11/605,425

(22) Filed: Nov. 29, 2006

(65) Prior Publication Data

US 2007/0072506 A1  Mar. 29, 2007

Related U.S. Application Data

(62) Division of application No. 10/920,306, filed on Aug. 18, 2004.

(51) Int. Cl.
*H01L 21/00* (2006.01)

(52) U.S. Cl. .......................... 438/108; 438/22; 313/500; 313/505; 445/23; 445/24

(58) Field of Classification Search .................. 438/108, 438/22; 313/500, 505; 445/23–24
See application file for complete search history.

(56) References Cited

U.S. PATENT DOCUMENTS

| | | | | |
|---|---|---|---|---|
| 5,273,608 | A * | 12/1993 | Nath | 156/301 |
| 5,474,620 | A * | 12/1995 | Nath et al. | 136/251 |
| 5,688,042 | A * | 11/1997 | Madadi et al. | 362/240 |
| 6,173,517 | B1 * | 1/2001 | Eibner et al. | 40/544 |
| 6,558,021 | B2 * | 5/2003 | Wu et al. | 362/249 |
| 6,657,381 | B1 * | 12/2003 | Arutaki | 313/512 |
| 6,660,935 | B2 * | 12/2003 | Southard et al. | 362/640 |
| 6,762,562 | B2 * | 7/2004 | Leong | 315/51 |
| 6,853,151 | B2 * | 2/2005 | Leong et al. | 315/185 R |
| 7,067,992 | B2 * | 6/2006 | Leong et al. | 315/291 |
| 7,217,012 | B2 * | 5/2007 | Southard et al. | 362/391 |
| 7,217,956 | B2 * | 5/2007 | Daniels et al. | 257/88 |
| 7,259,030 | B2 * | 8/2007 | Daniels et al. | 438/22 |
| 7,399,105 | B2 * | 7/2008 | Southard et al. | 362/391 |
| 7,427,782 | B2 * | 9/2008 | Daniels et al. | 257/80 |
| 7,476,557 | B2 * | 1/2009 | Daniels et al. | 438/22 |
| 2002/0174995 | A1 * | 11/2002 | Southard et al. | 174/48 |
| 2003/0031032 | A1 * | 2/2003 | Wu et al. | 362/564 |
| 2004/0095078 | A1 * | 5/2004 | Leong | 315/291 |
| 2004/0189218 | A1 * | 9/2004 | Leong et al. | 315/291 |
| 2005/0030765 | A1 * | 2/2005 | Southard et al. | 362/559 |
| 2005/0116235 | A1 * | 6/2005 | Schultz et al. | 257/79 |
| 2005/0162101 | A1 * | 7/2005 | Leong et al. | 315/291 |
| 2005/0212007 | A1 * | 9/2005 | Daniels et al. | 257/100 |
| 2005/0214963 | A1 * | 9/2005 | Daniels et al. | 438/29 |
| 2005/0281030 | A1 * | 12/2005 | Leong et al. | 362/234 |
| 2006/0038485 | A1 * | 2/2006 | Wang et al. | 313/500 |
| 2006/0189788 | A1 * | 8/2006 | Araki et al. | 528/425 |
| 2007/0026570 | A1 * | 2/2007 | Daniels et al. | 438/108 |

(Continued)

*Primary Examiner*—Laura M Menz
(74) *Attorney, Agent, or Firm*—Troxell Law Office, PLLC (57) ABSTRACT

A laminated light-emitting diode display device and a manufacturing method thereof are described. The laminated light-emitting diode display device has an insulator, a circuitry device placed on the insulator and having of a plurality of circuits interconnected with each other, and a plurality of SMT-type light-emitting diodes electrically connected to the circuits of the circuitry unit.

6 Claims, 8 Drawing Sheets

U.S. PATENT DOCUMENTS

| | | | |
|---|---|---|---|
| 2007/0026571 A1* | 2/2007 | Daniels et al. | 438/108 |
| 2007/0072506 A1* | 3/2007 | Wang et al. | 445/23 |
| 2007/0090387 A1* | 4/2007 | Daniels et al. | 257/99 |
| 2007/0105250 A1* | 5/2007 | Daniels et al. | 438/22 |
| 2007/0193089 A1* | 8/2007 | Hadaya | 40/544 |
| 2007/0228999 A1* | 10/2007 | Kit | 315/291 |
| 2007/0285933 A1* | 12/2007 | Southard et al. | 362/391 |
| 2007/0290217 A1* | 12/2007 | Daniels | 257/88 |
| 2008/0037262 A1* | 2/2008 | Wesson | 362/362 |
| 2008/0191220 A1* | 8/2008 | Daniels et al. | 257/88 |
| 2008/0266858 A1* | 10/2008 | Southard et al. | 362/249 |

* cited by examiner

LAMINATED LIGHT-EMITTING DIODE DISPLAY DEVICE AND MANUFACTURING METHOD THEREOF

RELATED APPLICATIONS

This application is a Division of currently pending application U.S. Ser. No. 10/920,306, entitled "LAMINATED LIGHT-EMITTING DIODE DISPLAY DEVICE AND MANUFACTURING METHOD THEREOF" and filed on Aug. 18, 2004.

BACKGROUND OF THE INVENTION

1. Field of the Invention

The present invention relates to a laminated light-emitting diode display device and a manufacturing method thereof, and more particularly, to a laminated light-emitting diode display device having the circuitry unit printed on the insulator for driving SMT-type light-emitting diodes to emit light in order to display characters or graphics.

2. Description of Prior Arts

Figure 1:
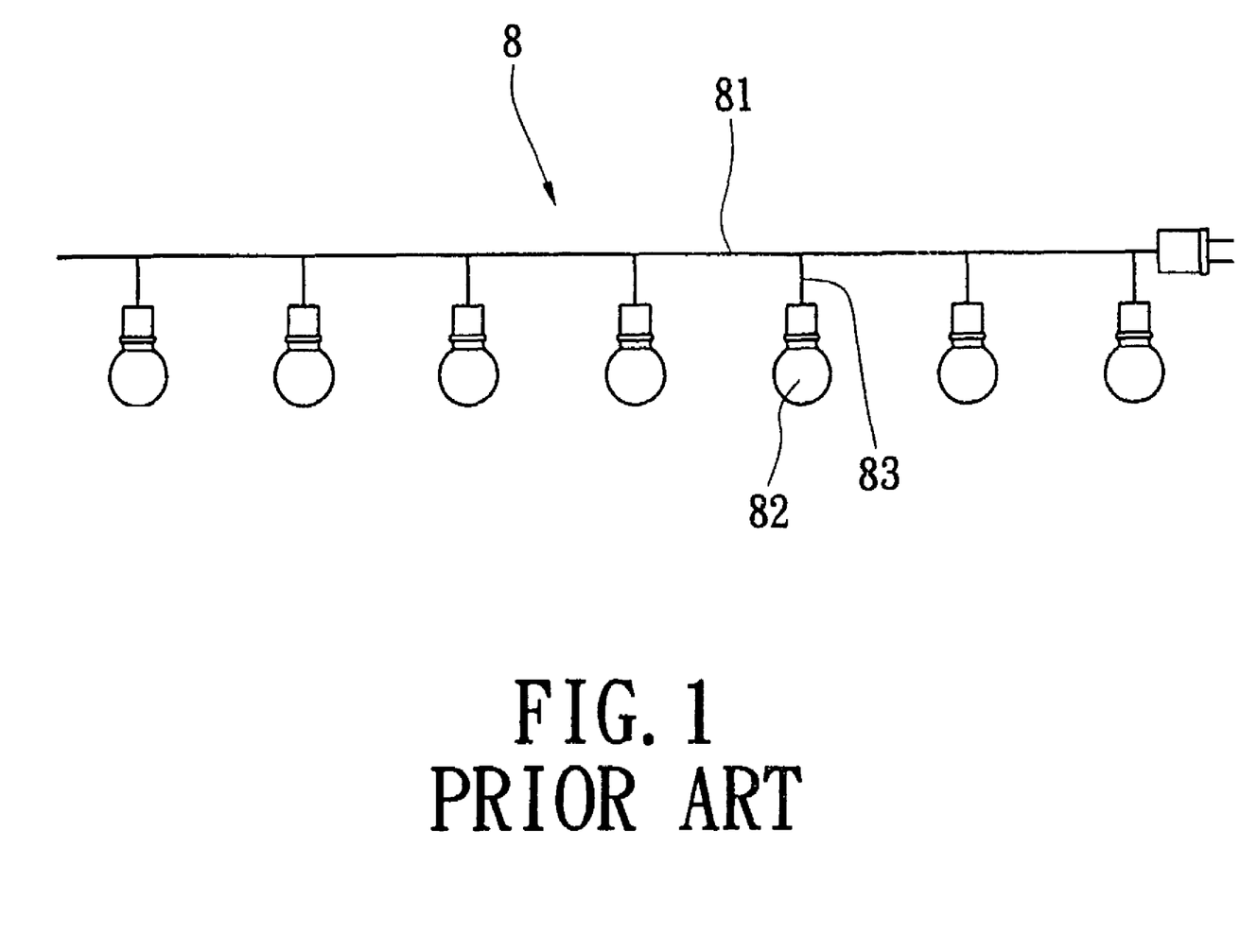
FIG. 1 is a schematic diagram showing a conventional light series.

Reference is made to FIG. 1 of a schematic diagram illustrating a conventional light series 8. The light series 8 includes a power core 81, light bulbs 82 and bulb receptors 83. The light series 8 could be placed on somewhere in accordance with users' preferences and arranged in users' preferred manners in order to display desired characters or graphics.

Figure 2:
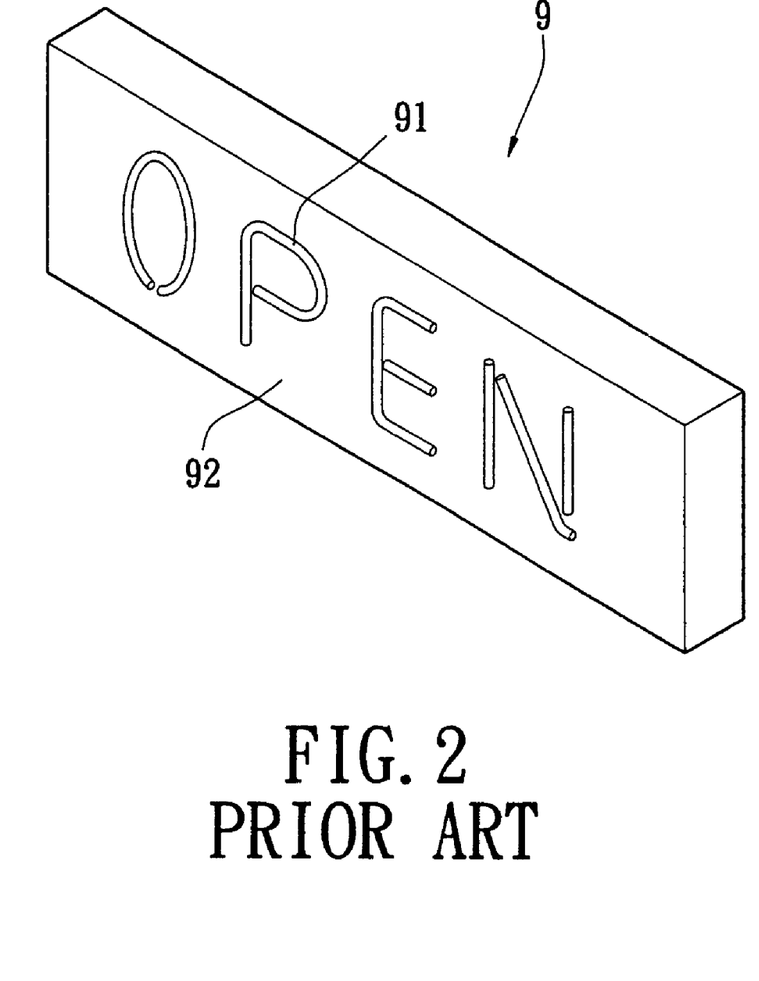
FIG. 2 is a schematic diagram showing a conventional neon lamp.

Reference is made to FIG. 2 of a schematic diagram showing a conventional neon lamp 9. The neon lamp 9 consists of neon light lamps 91 and a decorative plate 92 having the neon light lamp placed thereon. Neon light lamps 91 can be arranged as preferred characters or graphics.

However, the aforementioned light series 8 or neon lamp 9 has its own thickness and occupies a specific volume, and thus is not capable of being adhered in some locations under certain conditions, therefore limiting its application.

Moreover, light bulbs 92 of the conventional light series 8 or neon light lamps 91 of the conventional neon lamp 9 are connected to each other through wires, making the assembly process for both more complicated and rendering the manufacturing more time-consuming.

SUMMARY OF THE INVENTION

It is therefore a primary objective of the present invention to provide a laminated light-emitting diode display device and a manufacturing method thereof. The present invention display device comprises a laminated design so as to reduce effectively the thickness as a whole and facilitate the placement thereof. Meanwhile, the assembly process for the present invention display device is not that time-consuming, compared to that the prior art light series or neon lamp, and thus leads to less manufacturing effort.

In accordance with the claimed invention, the laminated light-emitting diode display device includes an insulator, a circuitry device placed on the insulator and consisting of a plurality of circuits interconnected with each other, and a plurality of SMT-type light-emitting diodes electrically connected to the circuits of the circuitry unit.

The present invention further provides a corresponding manufacturing method for the laminated, light-emitting diode display device. The manufacturing method includes steps of preparing an insulator, placing a circuitry unit having a plurality of circuits on the insulator, and electrically connecting a plurality of SMT-type light-emitting diodes to the circuits of the circuitry unit.

These and other objectives of the present invention will no doubt become obvious to those of ordinary skill in the art after reading the following detailed description of the preferred embodiment illustrated in the various figures and drawings.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE PREFERRED EMBODIMENT

Figure 3:
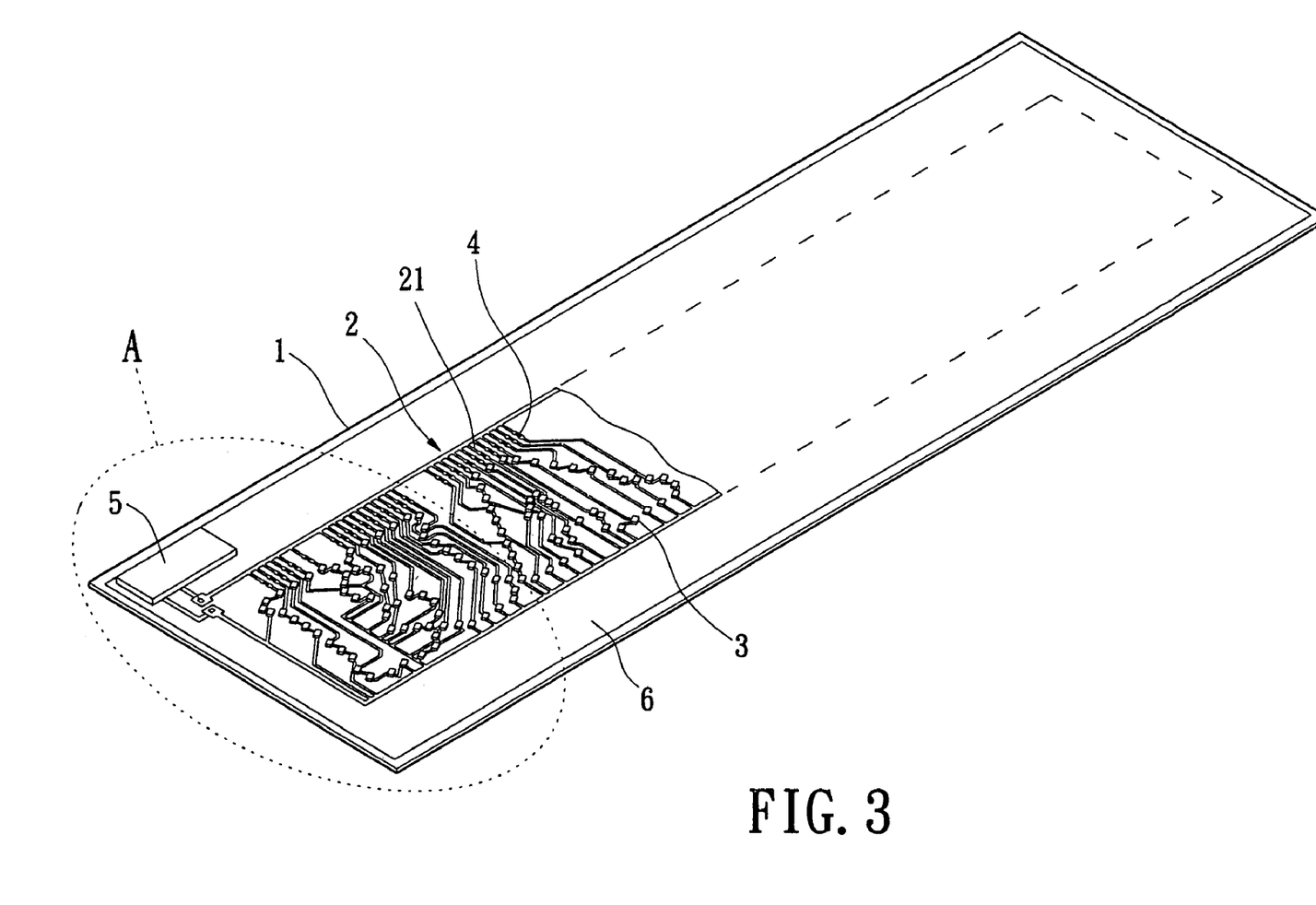
FIG. 3 is a schematic diagram showing a laminated light-emitting diode display device according to the present invention.
Figure 4:
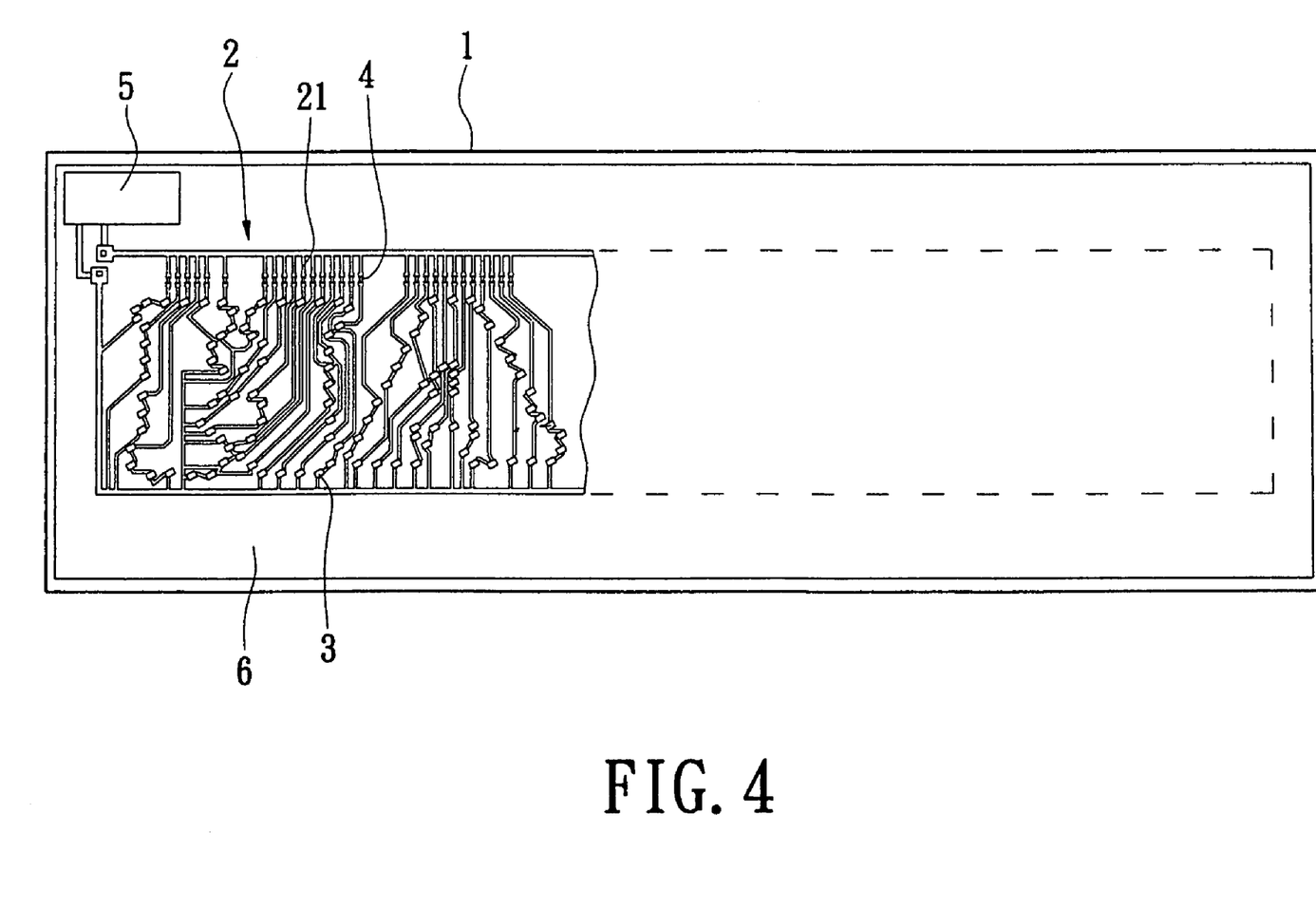
FIG. 4 is a top view of the laminated light-emitting diode display device according to the present invention.

Reference is made to FIGS. 3 and 4 of schematic diagrams of laminated light-emitting diode display devices according to the present invention. The present invention display device includes an insulator 1, a circuitry unit 2 and a plurality of light-emitting diodes 3. The insulator is made of a glass, a paper or a transparent plastic thin film. The shape of the insulator is not limited and thus can be in a variety of different forms in practical use. The preferred embodiment 1 is in the form of a rectangle.

The circuitry unit 2 is placed upon the insulator 1 by printing, electroplating or chemical deposition. The circuitry unit 2 consists of a plurality of circuits 21 made of highly conductive materials. The arrangement of circuits 21 is not specifically limited and changes based on practical use along with the placement of light-emitting diodes 3. The circuitry unit 2 further connects to appropriate power sources.

Figure 3A:
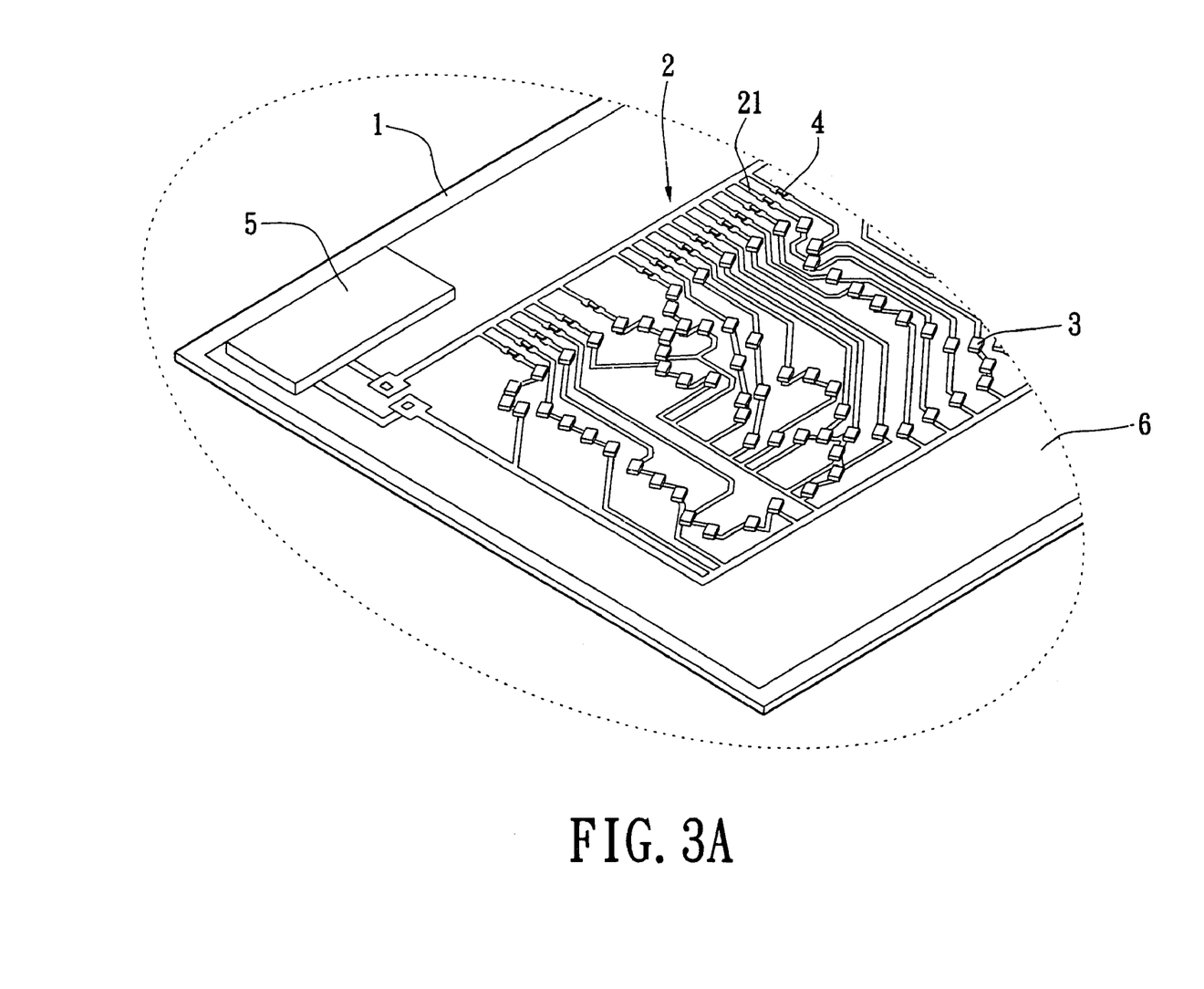
FIG. 3A is a schematic diagram partially detailing part A in FIG. 3.

Light-emitting diodes 3 are SMT-type light-emitting diodes, meaning light-emitting diodes 3 are capable of being adhered to circuits 21 of the circuitry unit 2 (shown in FIG. 3A). Under this configuration, light-emitting diodes 3 are placed on the insulator 1 and electrically connect to the circuitry unit 2, which serves as a power source for light-emitting diodes 3. The number and arrangement of these light-emitting diodes 3 are not limited either. Light-emitting diodes 3 can be arranged as characters or graphics and in the present embodiment they are arranged as English characters.

Additionally, the circuits 21 of the circuitry unit 2 further electrically connect to a plurality of resistors 4 providing the protection of the circuit. Circuits 21 further electrically connect to a controlling integrated circuit (IC) 5 controlling the on/off of these light-emitting diodes 3 and thus providing the on/off variance of these light-emitting diodes 3. Moreover, a protective thin film 6 further encapsulates the insulator, the circuitry unit 2, light-emitting diodes 3, resistors 4 and the controlling IC 5 for dust and waterproofing.

Figure 6:
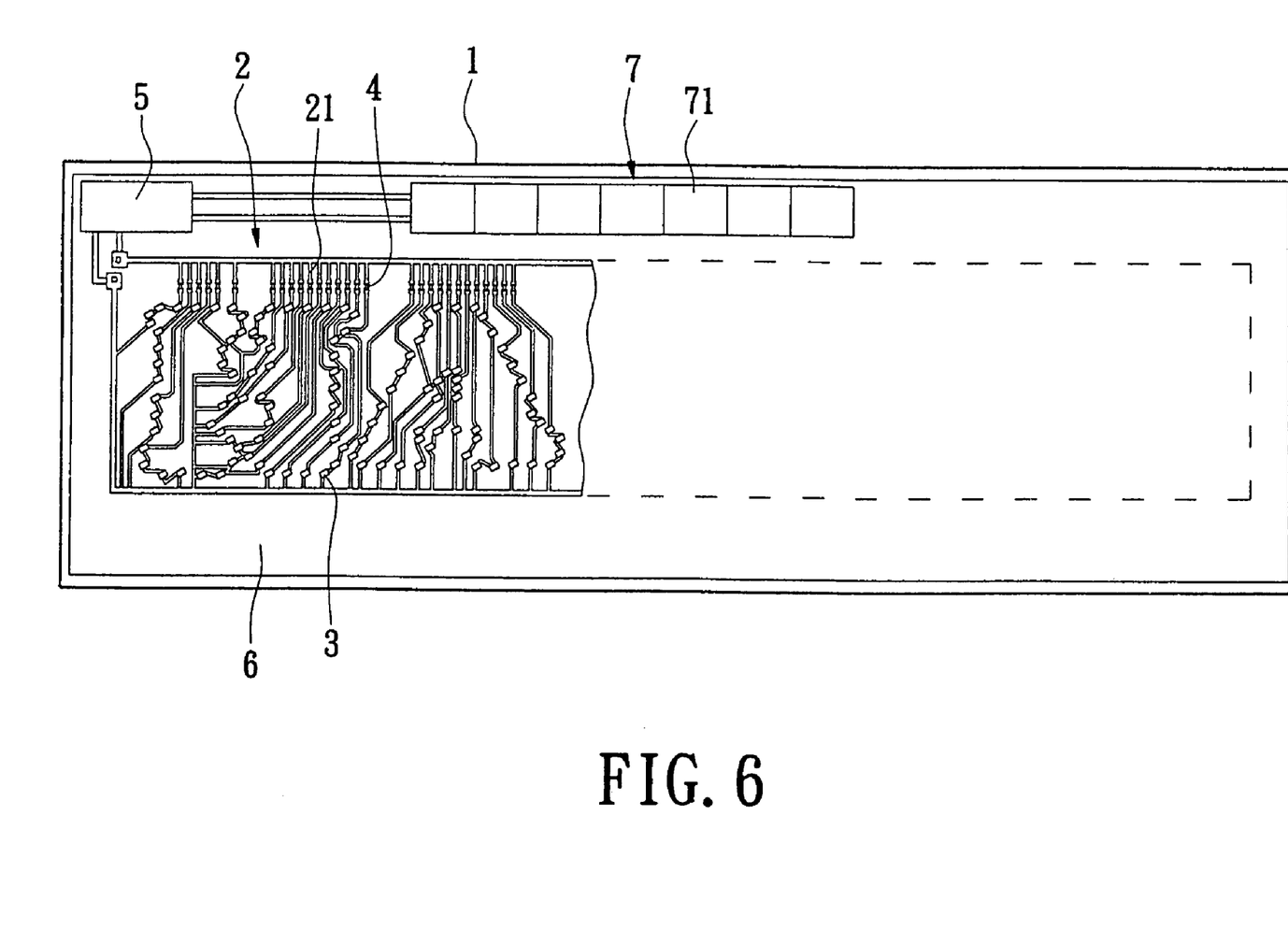
FIG. 6 is a top view of another preferred embodiment according to the present invention.

Reference is made to FIG. 6 of a schematic diagram showing a solar power-generating device 7 on the insulator 1. The solar-power-generating device 7 includes a solar power plate 71 electrically connected to circuits 21 of the circuitry unit 2, whereby solar energy powers the display device.

Figure 5:
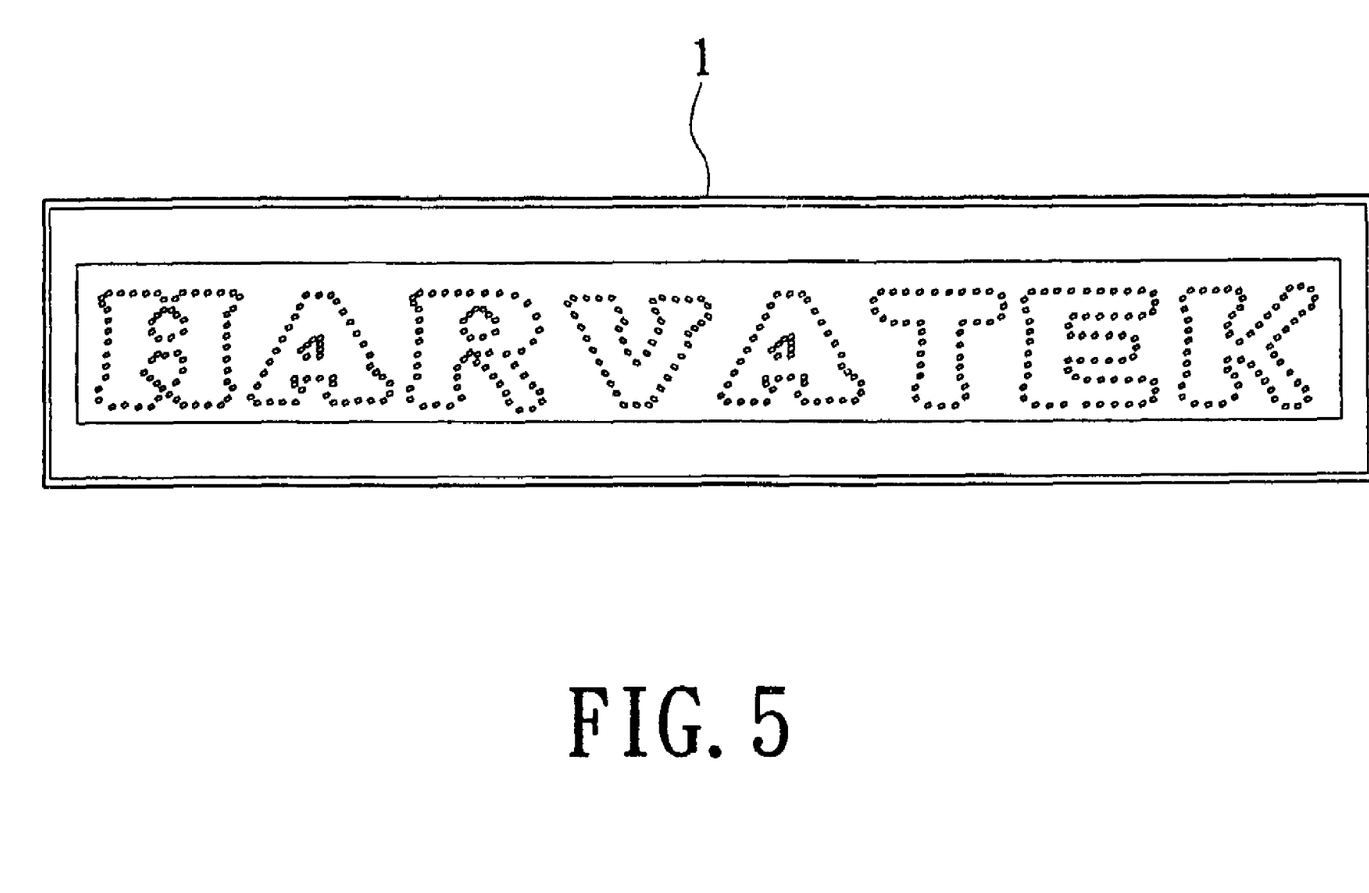
FIG. 5 shows the operation status of the laminated light-emitting diode display device according to the present invention.

The present invention primarily provides a laminated light-emitting diode display device having the circuitry unit 2 printed on the insulator 1, SMT-type light-emitting diodes 3 and the power source in order to display desired characters or graphics (shown in FIG. 5).

The laminated light-emitting diode display device according to the present invention is comparatively thin and thus is easily packed and stored, as well as being applicable in many occasions.

The circuitry unit 2 is printed on the insulator 1 and light-emitting diodes 3 are surface molded by surface molding technology (SMT) on the insulator for electrically connecting to the circuitry unit 2, making the assembly process for the present invention display device easy and reduces effort in manufacturing.

Figure 7:
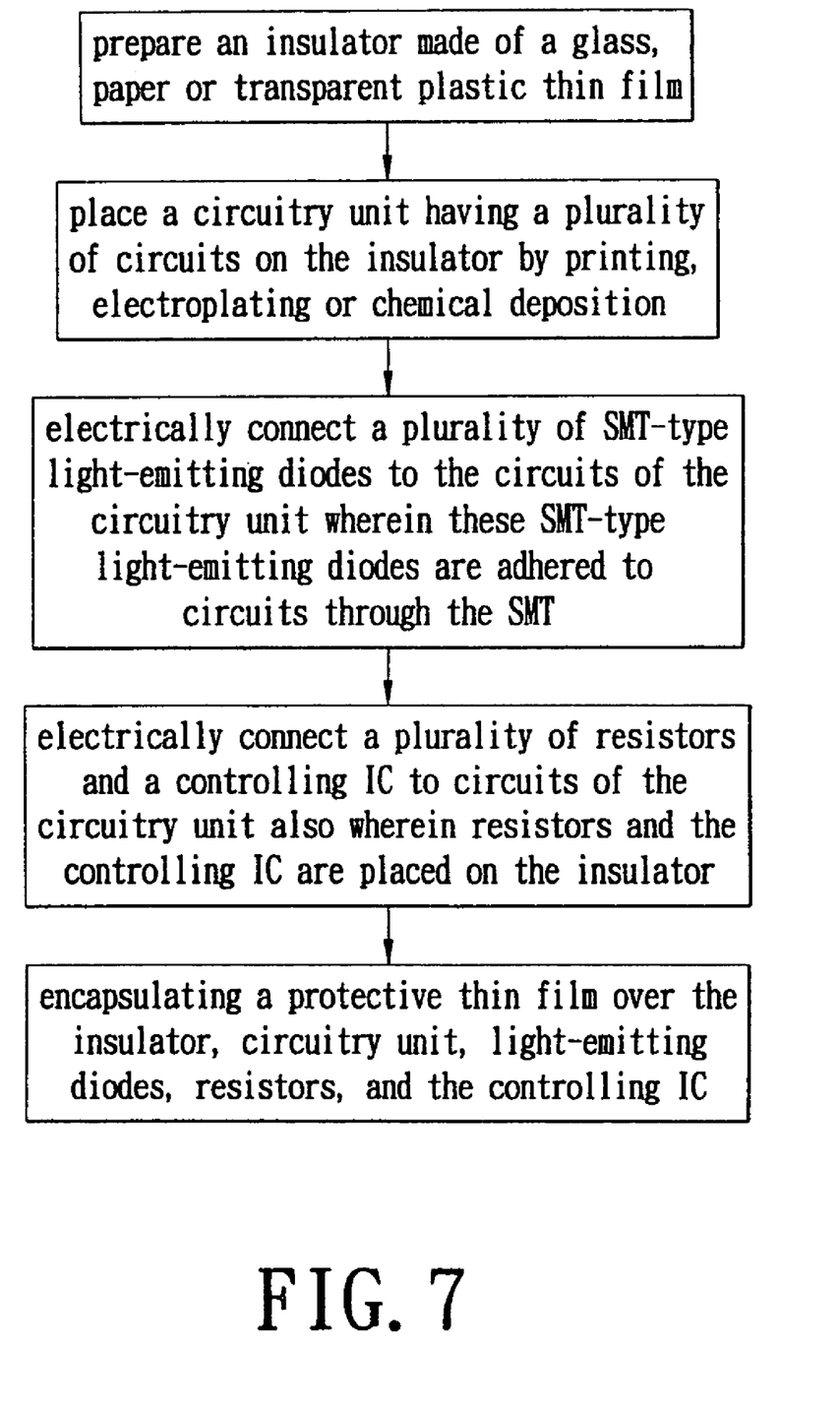
FIG. 7 shows a flow chart of the manufacturing method for the laminated light-emitting diode display device according to the present invention

Reference is made to FIG. 7 of a flow chart of the present invention manufacturing method for the laminated light-emitting diode display device. The manufacturing method includes steps of (a) preparing an insulator 1 (shown in FIGS. 3 and 4) made of a glass, paper or transparent plastic thin film, (b) placing a circuitry unit 2 having a plurality of circuits 21 on the insulator 1 by printing, electroplating or chemical deposition, (c) electrically connecting a plurality of SMT-type light-emitting diodes 3 to the circuits 21 of the circuitry unit 2, in which these SMT-type light-emitting diodes 3 are adhered to circuits 2 through the SMT, (d) electrically connecting a plurality of resistors 4 and a controlling IC 5 to circuits 2 of the circuitry unit 2, with resistors 4 and the controlling IC are placed on the insulator 1, and (e) encapsulating the insulator 1, circuitry unit 2, light-emitting diodes 3, resistors 4, and the controlling IC 5 in a protective thin film 6.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for manufacturing a laminated light-emitting diode display device, comprising:

preparing an insulator with a laminated form, wherein the insulator has a top plane surface and a bottom plane;

placing a circuitry unit having a plurality of circuits on the top plane surface of the insulator; and locating a plurality of SMT-type light-emitting diodes as a pattern or a word to be electrically connected to the circuits of the circuitry unit in order to illuminate the pattern or the word; and placing a protective thin film with a laminated form on the insulator, the circuitry unit and the light-emitting diodes in order to protect the insulator, the circuitry unit and the light-emitting diodes.

2. The method in claim 1, wherein the insulator is made of a glass, a paper or a transparent plastic thin film.

3. The method in claim 1, wherein the circuitry unit is formed on the insulator by printing, electroplating or chemical deposition.

4. The method in claim 1, further comprising a step of electrically connecting a plurality of resistors to the circuits of the circuitry unit.

5. The method in claim 1, further comprising a step of electrically connecting a controlling integrated circuit (IC) to the circuits of the circuitry unit.

6. The method in claim 1, further comprising a step of encapsulating the insulator, the circuitry unit and the light-emitting diodes with a protective thin film.

\* \* \* \* \*